United States Patent [19]

Kumar

[11] Patent Number: 5,312,514
[45] Date of Patent: May 17, 1994

[54] METHOD OF MAKING A FIELD EMITTER DEVICE USING RANDOMLY LOCATED NUCLEI AS AN ETCH MASK

[75] Inventor: Nalin Kumar, Austin, Tex.

[73] Assignee: Microelectronics and Computer Technology Corporation, Austin, Tex.

[21] Appl. No.: 52,958

[22] Filed: Apr. 23, 1993

Related U.S. Application Data

[63] Continuation of Ser. No. 789,220, Nov. 7, 1991, abandoned.

[51] Int. Cl.⁵ ............................................. H01J 9/00
[52] U.S. Cl. .................................... 156/643; 156/647; 156/655; 156/656; 156/659.1; 204/192.1; 204/192.15; 427/248.1; 427/249; 427/250; 427/255; 427/256; 445/51
[58] Field of Search ............... 156/643, 655, 656, 647, 156/659.1, 667; 445/51; 427/248.1, 249, 250, 251, 252, 253, 255, 256, 280, 287; 204/192.1, 192.11, 192.12, 192.15

[56] References Cited

U.S. PATENT DOCUMENTS

| | | | |
|---|---|---|---|
| 3,894,332 | 7/1975 | Nathanson et al. | 313/336 |
| 3,947,716 | 3/1976 | Fraser, Jr. et al. | 313/336 |
| 3,970,887 | 7/1976 | Smith et al. | 313/309 |
| 3,998,678 | 12/1976 | Fukase et al. | 156/3 |
| 4,115,228 | 9/1978 | Heinrich et al. | 156/156 X |
| 4,139,773 | 2/1979 | Swanson | 250/423 |
| 4,307,507 | 12/1981 | Gray et al. | 29/580 |
| 4,350,926 | 9/1982 | Shelton | 313/455 |
| 4,465,551 | 8/1984 | Horwitz | 156/643 |
| 4,566,937 | 1/1986 | Pitts | 156/643 X |
| 4,612,085 | 9/1986 | Jelks et al. | 156/643 |
| 4,663,559 | 5/1987 | Christersen | 313/336 |
| 4,685,996 | 8/1987 | Busta et al. | 156/628 |
| 4,806,202 | 2/1989 | Tang et al. | 156/657 |
| 4,855,636 | 8/1989 | Busta et al. | 313/306 |
| 4,933,108 | 6/1990 | Soredal | 252/518 |
| 4,943,343 | 7/1990 | Bardai et al. | 156/643 |
| 4,964,946 | 10/1990 | Gray et al. | 156/643 |
| 4,968,382 | 11/1990 | Jacobson et al. | 156/156 X |
| 4,973,378 | 11/1990 | Lee et al. | 156/156 X |
| 5,035,768 | 7/1991 | Mu et al. | 156/156 X |

OTHER PUBLICATIONS

Maissel and Glang, *Handbook of Thin Film Technology*, 1983 Reissue, McGraw-Hill, New York, N.Y.
Cade and Lee, "Vacuum Microelectronics", *GEC J. Res. Inc.*, Marconi Rev., 7(3), 129 (1990).

*Primary Examiner*—Thi Dang
*Attorney, Agent, or Firm*—David M. Sigmond

[57] ABSTRACT

Method of making a field emitter device with submicron low work function emission tips without using photolithography. The method includes depositing in situ by evaporating or sputtering a discontinuous etch mask comprising randomly located discrete nuclei. In one embodiment an ion etch is applied to a low work function material covered by a discontinuous mask to form valleys in the low work function material with pyramid shaped emission tips therebetween. In another embodiment an ion etch is applied to an electrically conductive base material covered by a discontinuous mask to form valleys in the base material with pyramid shaped base tips therebetween. The base material is then coated with a low work function material to form emission tips thereon.

58 Claims, 3 Drawing Sheets

METHOD OF MAKING A FIELD EMITTER DEVICE USING RANDOMLY LOCATED NUCLEI AS AN ETCH MASK

CROSS-REFERENCE TO RELATED APPLICATIONS

This is a continuation of co-pending U.S. application Ser. No. 07/789,220 filed Nov. 7, 1991 now abandoned.

BACKGROUND OF THE INVENTION

1. Field of the Invention

The invention relates to field emitters, and more particularly to method which uses a discontinuous thin film of randomly located discrete nuclei as a discontinuous etch mask to fabricate a high efficiency large area field emitter device.

2. Description of Related Art

Field emitters are widely used in ordinary and scanning electron microscopes since emission is affected by the adsorbed materials. Field emitters have also been found useful in flat panel displays and vacuum microelectronics applications. Cold cathode and field emission based flat panel displays have several advantages over other types of flat panel displays, including low power dissipation, high intensity and low projected cost.

The present invention can be better appreciated with an understanding of the related physics. General electron emission can be analogized to the ionization of a free atom. Prior to ionization, the energy of electrons in an atom is lower than electrons at rest in a vacuum. In order to ionize the atom, energy must be supplied to the electrons in the atom. That is, the atom fails to spontaneously emit electrons unless the electrons are provided with energy greater than or equal to the electrons at rest in the vacuum. Energy can be provided by numerous means, such as by heat or irradiation with light. When sufficient energy is imparted to the atom, ionization occurs and the atom releases one or more electrons.

Several types of electron emissions are known. Thermionic emission involves an electrically charged particle emitted by an incandescent substance (as in a vacuum tube or incandescent light bulb). Photoemission releases electrons from a material by means of energy supplied by incidence of radiation, especially light. Secondary emission occurs by bombardment of a substance with charged particles such as electrons or ions. Electron injection involves the emission from one solid to another. Finally, field emission refers to the emission of electrons due to an electric field.

In field emission (or cold emission), electrons under the influence of a strong electric field are liberated out of a substance (usually a metal or semiconductor) into a dielectric (usually a vacuum). The electrons "tunnel" through a potential barrier instead of escaping "over" it as in thermionics or photoemission. Field emission is therefore a quantum-mechanics phenomena with no classical analog. A detailed explanation of field emission quantum mechanics is beyond the scope of the discussion herein. Nevertheless, field emitters have been extensively studied and are well known in the art. See generally, P. H. Cutler and T. T. Tsong, *Field Emission and Related Topics*, 1978.

The shape of a field emitter effects its emission characteristics. Field emission is most easily obtained from sharply pointed needles or tips whose ends have been smoothed into a nearly hemispherical shape by heating. Tip radii as small as 100 nanometers have been reported. As an electric field is applied, the electric lines of force diverge radially from the tip and the emitted electron trajectories initially follow these lines of force. Devices with such sharp features similar to a "Spindt cathode" have been previously invented. An overview of vacuum electronics and Spindt type cathodes can be found in the November and December, 1989 issues of *IEEE Transactions of Electronic Devices*. Fabrication of such fine tips, however, normally requires extensive fabrication facilities to finely tailor the emitter into a conical shape. Further, it is difficult to build high performance large area field emitters (i.e. more than a few sources per square micron area) since the cone size is limited by the lithographic equipment. It is also difficult to perform fine feature lithography on large area substrates as required by flat panel display type applications. Thus, there is a need for a method of making field emitters with fine conical or pyramid shaped features without the use of lithography.

The work function of the electron emitting surface or emission tip of a field emitter also effects emission characteristics. The work function is the voltage (or energy) required to extract or emit electrons from a surface. The lower the work function, the lower the voltage required to produce a particular amount of emission.

Prior attempts to fabricate field emitter devices have included the following:

U.S. Pat. No. 3,947,716 describes enhancing emission quality by altering the molecular structure of a tip to lower the work function of the planes where increased adsorption is desired, and increasing the work function in regions where less adsorption is desired. The molecular alteration is accomplished with thermal field buildup by subjecting the emitter tip to heating pulses in the presence of an electrostatic field to cause surface migration of the tip atoms along the field lines.

U.S. Pat. No. 3,970,887 describes a semiconductor substrate with integral field emitter tips in which an insulating layer and conductive layer are provided with openings at the tips to form micro-anode structures for each tip. The tips are electrically isolated from one another by initially doping the substrate to provide opposite conductivity-type regions at each tip.

U.S. Pat. No. 3,998,678 describes making field emitters by forming a metal layer on a substrate, forming conical emitters on the metal, forming an insulating layer with height equal to the emitters, forming another metal layer as an accelerating electrode, and etching he insulating layer to expose the emitters.

U.S. Pat. No. 4,307,507 describes making field emitters by selectively masking a single crystal substrate so that the unmasked regions define islands, orientation-dependent etching the substrate to from holes whose sides intersect at a crystallographically sharp point, removing the mask, covering the substrate and filling the holes with an emissive material, and etching the substrate to expose sharp emission tips.

U.S. Pat. No. 4,685,996 describes making field emitters by anisotropically etching a single crystal silicon substrate through photoresist openings to form funnel shaped protrusions thereon, then conformally depositing a refractory metal onto the protrusions.

U.S. Pat. No. 4,933,108 describes making field emitters by coating a metal carrier wire with crystals of an oxide compound which has a metallic luster and which is a compound transition metal selected from the group of tungsten, molybdenum, niobium, vanadium and titanium.

Finally, U.S. Pat. No. 4,943,343 describes a self-aligned gate process for making field emitters which includes forming conical emission tips on a substrate, depositing oxide on the tips, depositing gate metal on the oxide, depositing photoresist on the gate metal, etching the resist to expose gate metal above the tips, etching the exposed gate metal, removing the resist, and etching the exposed oxide to expose the emission tips.

Nevertheless, there still exists a need for relatively simple methods of making field emitter devices with low work function materials to produce sub-micron conically shaped emission tips without the use of photolithography.

SUMMARY OF THE INVENTION

An object of the present invention is a process for fabricating large area field emitters with sharp sub-micron features without requiring photolithography.

Another object of the present invention is to provide field emitter devices containing low work function emission tips which require only a relatively small voltage for field emission to occur.

Still another object of the present invention is a process for fabricating field emitter devices which uses relatively few process steps.

A feature of the present invention in accordance with one embodiment is a method of making a field emitter device comprising the steps of providing substrate, depositing a continuous layer of a low work function material on the substrate, depositing by evaporation or sputtering in situ a discontinuous layer of randomly located discrete nuclei to form a randomly patterned etch mask on the low work function material in order to expose some portions of the low work function material while covering other portions thereof, etching the exposed portions of the low work function material by applying an ion etch wherein the low work function material etches at a greater rate than the etch mask so as to form vertical valleys in the low work function material with pyramid shaped emission tips between the valleys, and removing the etch mask from the low work function material.

A further feature of the present invention in accordance with another embodiment is a method of making a field emitter device comprising the steps of providing substrate, depositing a continuous layer of a base material on the substrate, depositing by evaporation or sputtering in situ a discontinuous layer of randomly located discrete nuclei to form a randomly patterned etch mask on the base material in order to expose some portions of the base material while covering other portions thereof, etching the exposed portions of the base material by applying an ion etch wherein the base material etches at a greater rate than the etch mask so as to form vertical valleys in the base material with base tips between the valleys, removing the etch mask from the base material, and then depositing a low work function material on the base material to form pyramid shaped emission tips between the valleys.

The present invention advantageously makes use of thin film technology principles which have been known and studied for many years and published in several books. See, for instance, Maissel and Glang, *HANDBOOK OF THIN FILM TECHNOLOGY*, 1983 Reissue, McGraw-Hill Book Company, which is incorporated herein by reference.

Another advantage of the present invention is the relative ease and simplicity of the process steps compared to photolithography.

These and other objects, features and advantages of the present invention will be further described and more readily apparent from a review of the detailed description and preferred embodiments which follow.

BRIEF DESCRIPTION OF THE DRAWINGS

The following detailed description of the preferred embodiments can best be understood when read in conjunction with the following drawings, wherein.

DETAILED DESCRIPTION OF THE PREFERRED EMBODIMENTS

Figure 1A:
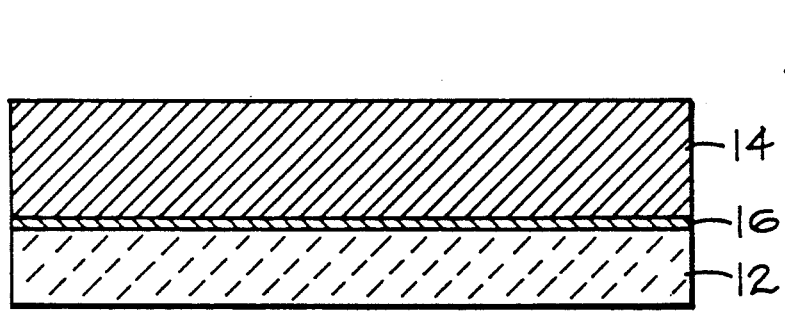
FIGS. 1A-1D show cross-sectional views of successive stages of fabricating a field emitter device in accordance with one embodiment of the present invention.

Referring now to the drawings wherein depicted elements are not necessarily shown to scale and wherein like or similar elements are designated by the same reference numeral through the several views, and more particularly to FIGS. 1A-1D, there are shown successive cross-sectional views of fabricating a field emitter device generally designated 10 according to a one embodiment of the present invention.

With reference now to FIG. 1A, a large area substrate 12 with a planar top surface is provided. Substrate 12 is preferably glass, silicon or a metal although other materials can be used, the requirement being they provide a base upon which a plurality of emission tips can be fabricated. A continuous layer of a low work function material 14 is deposited on substrate 12. A low work function material for the present invention must be 4.5 electron-volts or less, preferably 2.5 electron-volts or less. Suitable low work function materials include tri-chromium mono-silicon ($Cr_3Si$), tantalum-nitride (TaN). Numerous other low work function compounds, metals (cesium) and cermets (e.g., tri-chromium mono-silicon silicon-dioxide ($Cr_3Si$—$SiO_2$), tri-chromium mono-silicon magnesium-oxide ($Cr_3Si$—MgO), gold silicon-dioxide (Au—$SiO_2$), and gold magnesium-oxide (Au—MgO)) are also suitable. Low work function material 14 can be deposited by ion beam sputtering, laser deposition, evaporation, chemical vapor deposition, and preferably by sputtering. An optional adhesion layer 16 such as 500 angstroms titanium, chromium, tantalum, titanium-tungsten or nickel-chromium can be deposited between substrate 12 and material 14.

Figure 1B:
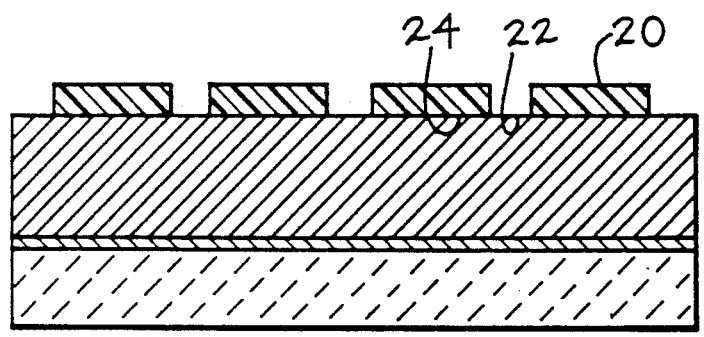

Referring now to FIG. 1B, a discontinuous layer of an etch mask 20 is deposited in situ on material 14. That is, the discontinuities are formed as mask 20 is deposited as opposed to depositing a blanket layer 20 and then selectively patterning openings therein such as by photolithography. More particularly, etch mask 20 is formed by depositing in situ a discontinuous layer comprising randomly located discrete nuclei having discontinuities between the nuclei so as to form the etch mask 20 on the low work function material 14, thereby exposing some portions of the low work function material 14 (beneath the discontinuities) while covering other portions of material 20 (beneath the nuclei). Thus, the discontinuities between the nuclei are formed as the etch mask is deposited. The random location of the nuclei ensures that the locations of the discontinuities, the exposed and covered portions of the material, and the pattern of the mask are random as well. As may be seen, mask 20 serves to expose portions 22 of material 14 while covering other portions 24 of material 14. Mask 20 may be deposited by sputtering, ion beam sputtering, and preferably by evaporation. Suitable mask materials include aluminum-oxide ($Al_2O_3$), carbon and gold. It is noted that these mask materials are non-polymerized materials with relatively high melting points (i.e., above approximately 1,000° C.) Aluminum-oxide is preferred due to its very low sputtering yield (i.e., for an incoming atom how many atoms are etched off). A low sputtering yield in mask 20 relative to material 14 allows deep valleys to be etched in material 14 while using a thin etch mask 20. Sputtering yields of various materials in argon are tabulated on p. 4–40 in *Maissel and Glang*.

The discontinuities or through-holes can be formed in situ as etch mask 20 is deposited using techniques known to those having skill in the art. For instance, *Maissel and Glang* at p. 8-33 report a nucleation and growth model in which a thin film having a thickness of 100 angstroms or less is generally discontinuous. Furthermore, *Maissel and Glang* report experimental verification of this model at pp. 10–42 and 10–43. Generally speaking, a nucleation site is a random site where the first set of atoms/molecules reside during the initial formation of a thin film. A majority (if not essentially all) of the nuclei grow as deposition occurs. Growth of the nuclei is three-dimensional but the growth parallel to the substrate may be greater than normal to it. Moreover, the majority (if not essentially all) of growth of the nuclei does not result from coalescence of the nuclei. Even though the number and sizes of the nuclei which comprise the discontinuous thin film layer depend on the substrate temperature, activation of nuclei adatoms, and duration of deposition, under proper conditions it is possible to accurately control the size of the nuclei. For instance, FIG. 21(a) on p. 10–42 of *Maissel and Glang* shows a large number of discrete three-dimensional nuclei in which the width of each nucleus is less than 1,000 angstroms and each nucleus is spaced by a discontinuity of less than 1,000 angstroms from the nearest adjacent nucleus. Regarding minimum thicknesses, a thin film less than 10 angstroms thick may fail to provide a reliable etch mask 20. Therefore, a discontinuous layer of etch mask 20 between 10 and 100 angstroms thick formed in situ during deposition is preferred.

Figure 1C:
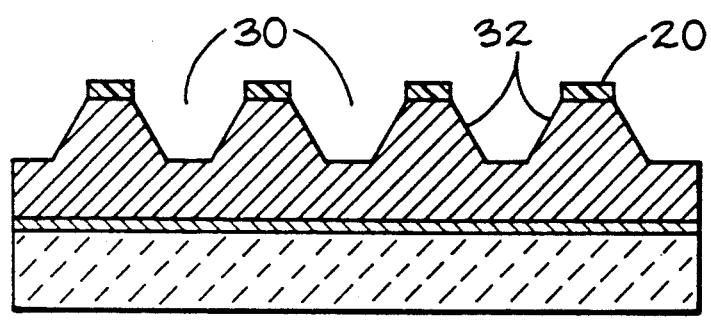

With reference now to FIG. 1C, an ion etch is applied to the top of device 10. Material 14, mask 20 and the ion etch are selected such that material 14 etches at a greater rate than mask 20. Preferably, material 14 etches at at least twice the rate as mask 20. As a result, vertical valleys 30 formed at the exposed portions 22 extend partially through material 14, preferably between 100 angstroms and 1 micron deep, although if desired valleys 30 could extend completely through material 14. Additionally, randomly located emission tips 32 are formed between valleys 30. Due to undercutting, a wet chemical etch would not be suitable for etching material 14.

Figure 1D:
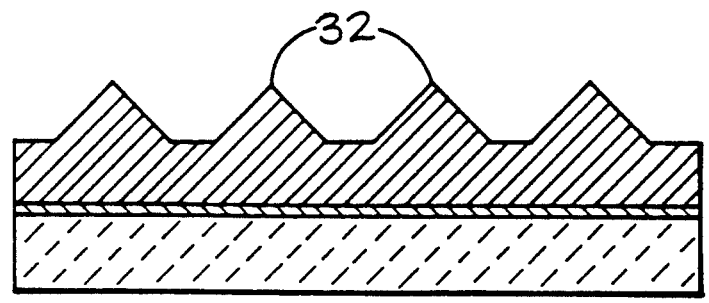

Referring now to FIG. 1D, the ion etch is continued so as to completely remove mask 20. In addition, emission tips 32 should eventually assume a conical pyramid shape due to preferential etching of the grain boundaries as has been previously demonstrated by heavy ion bombardment of copper films. In the event the low work function material 14 contains different materials with different etch rates the ion etch may have to be carefully monitored to prevent completely removing one material thereby changing the work function of the material which remains on the substrate. For example, ion etching tantalum-nitride may remove all the nitride leaving a tantalum layer with too high a work function.

Alternatively, if desired, the ion etch could be halted before mask 20 is completely removed. The rest of mask 20 could then be removed by either wet chemical etching or dry etching. The resultant emission tips would assume a rectangular pyramid shape, as seen in FIG. 1C. This would not normally be preferred, however, since the conical pyramid shape most enhances the electrical field distribution near the emission surface as field emission occurs.

While the simplicity of the embodiment in FIGS. 1A-1D is advantageous, certain difficulties may also arise. For instance, there may be only a small difference in the etch rates of the low work function material 14 and an aluminum-oxide mask 20. A limited thickness needed for a discontinuous mask 20 deposited in situ might severely limit the depth of valleys 30. And most low work function materials are either compounds or cermets which get destroyed by sputter ion etching.

With reference now to FIGS. 2A-2E, there are shown successive cross-sectional views of fabricating a field emitter device 40 according to another embodiment of the present invention which overcomes the previously described difficulties for the embodiment in FIGS. 1A-1D at the cost of added complexity.

Figure 2A:
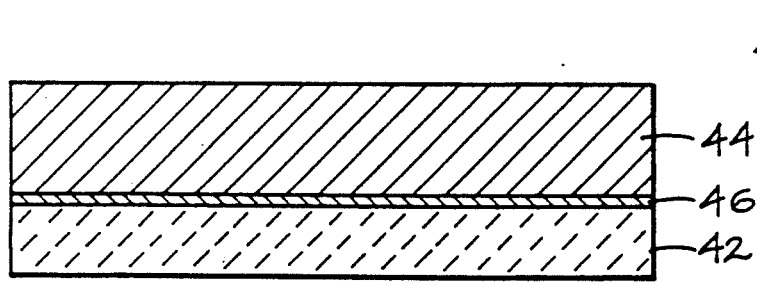
FIGS. 2A-2E show cross-sectional views of successive stages of fabricating a field emitter device in accordance with another embodiment of the present invention.

Referring now to FIG. 2A, a relatively thick (1,000 angstroms to 2 microns) continuous layer of an electrically conductive base material 44 is sputter deposited on a substrate 42 (similar to substrate 12) with optional adhesion layer 46 (similar to adhesion layer 16) sandwiched therebetween. A preferred base material 44 is 1 micron thick copper.

Figure 2B:
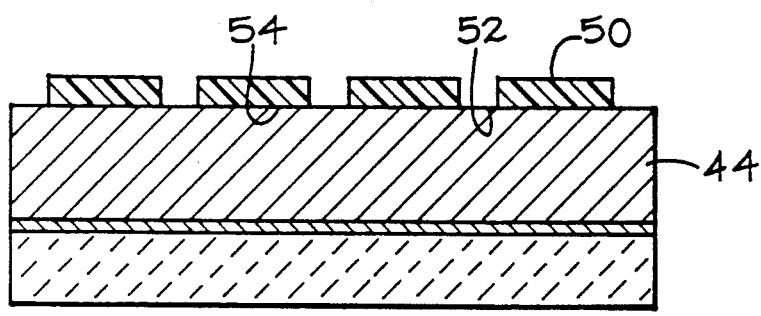

With reference now to FIG. 2B, a discontinuous layer of an etch mask 50 (similar to mask 20) is deposited on base material 44 such that the discontinuities are formed in situ as deposition occurs, thereby exposing portions 52 of material 44 while covering portions 54 of material 44. The same materials, thicknesses, deposition techniques and randomness previously described for mask 20 apply to mask 50.

Figure 2C:
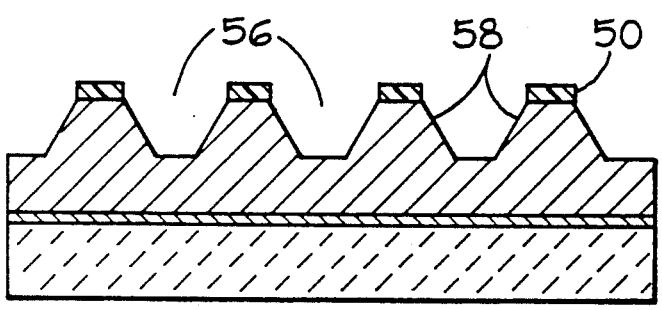

Referring now to FIG. 2C, an ion etch is applied to the top of device 40. Material 44, mask 50 and the ion etch are selected such that material 44 etches at a greater rate than mask 50, preferably at at least twice the etch rate. As a result, vertical valleys 56 formed at the exposed portions 52 extend partially through material 44, and tip bases 58 are formed between valleys 56. If desired, valleys 56 could extend completely through material 44. With 1,000 electron-volt argon ions in the present illustration the large difference in sputtering yields of aluminum-oxide mask 50 and copper base material 44 (0.04 and 3.2, respectively) produces very high aspect ratios for valleys 56.

Figure 2D:
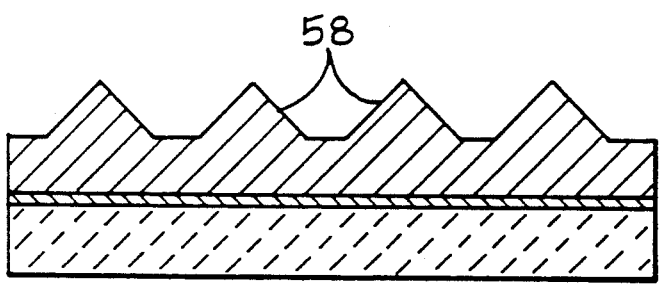

With reference now to FIG. 2D, the ion etch is continued so as to completely remove mask 50. In addition, base tips 58 assume a conical pyramid shape.

Figure 2E:
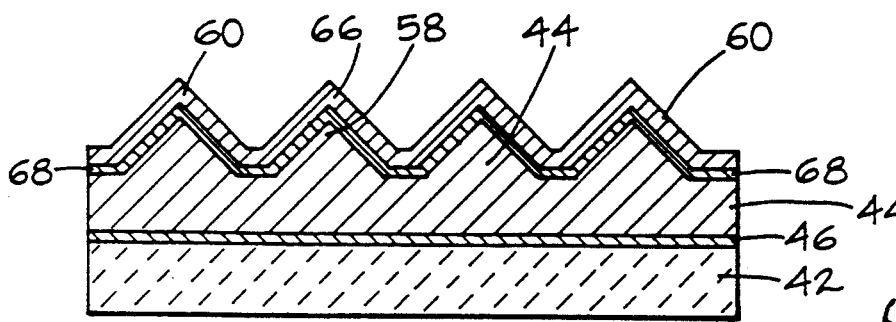

Referring now to FIG. 2E, a coating of low work function material 60 (similar to material 14) is deposited on base material 44, thereby forming randomly located conical pyramid shaped emission tips 66 on base tips 58. An optional adhesion layer 68 (similar to adhesion layer 16) can be sandwiched between materials 44 and 68.

Alternatively, as previously described, the ion etch could be halted before completely removing mask 50, and a wet chemical etch or dry etch could remove the rest of mask 50 prior to depositing low work function material 60. However, the resultant base tips 58 and emission tips 66 would assume the rectangular pyramid shape seen in FIG. 2C.

Figure 3:
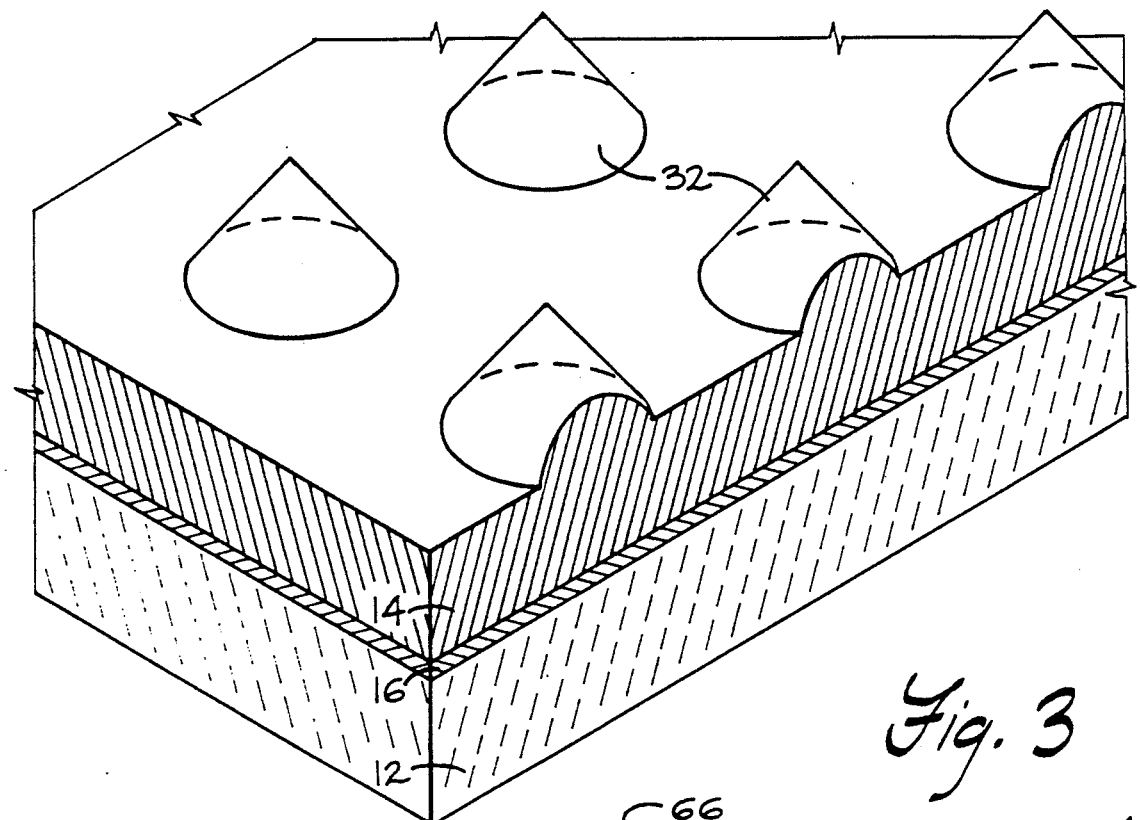
FIG. 3 shows an elevational perspective view of a field emitter device fabricated in accordance with FIGS. 1A-1D.
Figure 4:
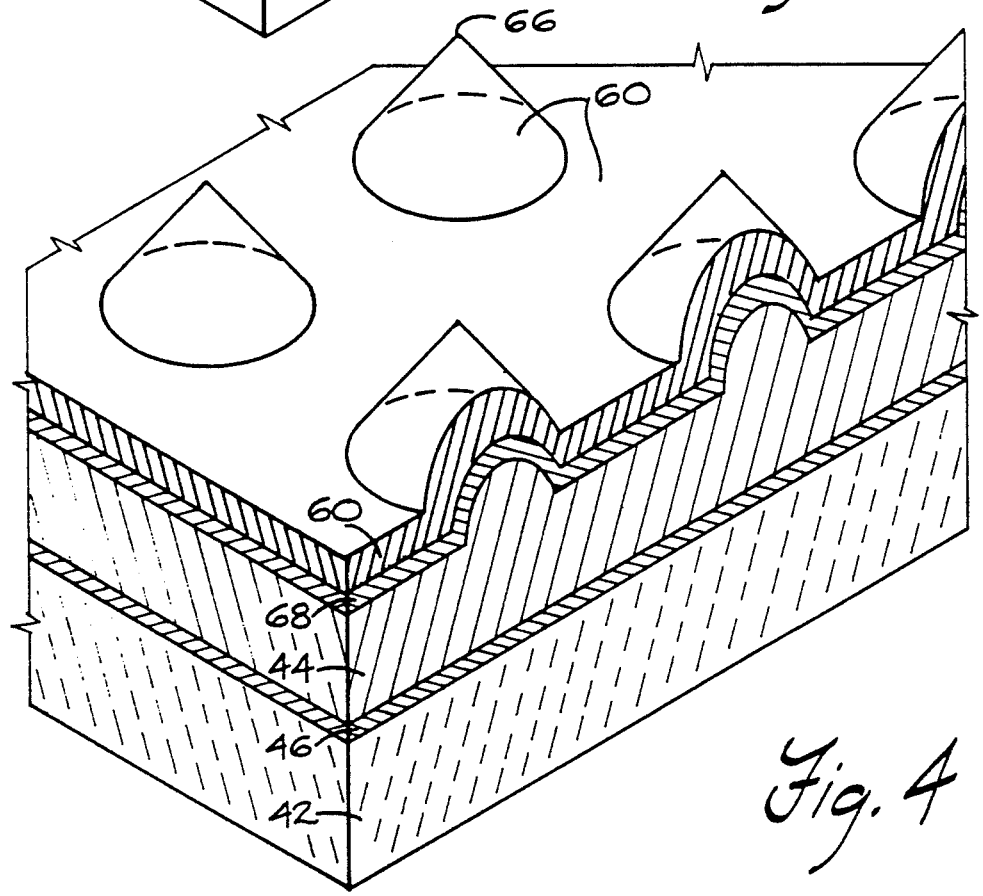
FIG. 4 shows an elevational perspective view of a field emitter device fabricated in accordance with FIGS. 2A-2E.

With reference now to FIGS. 3 and 4, elevational perspective views are shown of field emitter devices fabricated in accordance with FIGS. 1A-1D and 2A-2E, respectively.

Other such possibilities should readily suggest themselves to persons skilled in the art. For example, the emission tips could assume circular or irregular pyramid shapes. Also, only a generic structure of a field emitter device has been shown herein. No attempt has been made to describe the various structures and devices in which such an emitter may be used.

The present invention, therefore, is well adapted to carry out the objects and attain the ends and advantages mentioned, as well as others inherent therein. While presently preferred embodiments of the present invention have been described for the purpose of disclosure, numerous other changes in the details of construction, arrangement of parts, compositions and materials selection, and processing steps can be carried out without departing from the spirit of the present invention which is intended to be limited only by the scope of the appended claims.

What is claimed is:

1. A method of making a field emitter device, comprising the following steps:
   providing a substrate;
   depositing a continuous layer of a low work function material on the substrate;
   depositing in situ by evaporation or sputtering a non-polymerized randomly patterned etch mask with a relatively high melting point on the low work function material, said etch mask comprising randomly located discrete nuclei with discontinuities therebetween thereby exposing portions of the low work function material beneath the discontinuities while covering other portions thereof beneath the nuclei;
   etching the exposed portions of the low work function material by applying an ion etch after the deposition of nuclei begins, wherein the low work function material etches at a greater rate than the etch mask so as to form valleys in the low work function material with emission tips between the valleys; and
   removing the etch mask from the low work function material.

2. The method as recited in claim 1 wherein the substrate is selected from the group consisting of glass, silicon and a metal.

3. The method as recited in claim 1 wherein the work function of the low work function material is less than 2.5 electron-volts.

4. The method as recited in claim 1 wherein the low work function material is selected from the group consisting of tri-chromium mono-silicon, tantalum-nitride, cesium, tri-chromium mono-silicon silicon-dioxide, tri-chromium mono-silicon magnesium-oxide, gold silicon-dioxide, and gold magnesium-oxide.

5. The method as recited in claim 1 wherein the etch mask is deposited by evaporation.

6. The method as recited in claim 1 wherein the etch mask is deposited by sputtering.

7. The method as recited in claim 1 wherein the etch mask is selected from the group consisting of aluminum-oxide, carbon and gold.

8. The method as recited in claim 1 wherein the etch mask is between 10 angstroms and 100 angstroms thick.

9. The method as recited in claim 1 wherein the valleys are between 100 angstroms and 1 micron deep.

10. The method as recited in claim 1 wherein the low work function material etches at at least twice the rate of the etch mask.

11. The method as recited in claim 1 wherein only the exposed portions of the low work function material are etched by the ion etch, after the ion etch the remaining etch mask is removed by a separate etch, and the emission tips assume a rectangular pyramid shape.

12. The method as recited in claim 1 wherein the ion etch completely removes the etch mask and the ion etch is continued until the emission tips assume a conical pyramid shape.

13. The method as recited in claim 1, further comprising depositing an adhesive layer between the substrate and the low work function material.

14. The method as recited in claim 13 wherein the adhesive layer is selected from the group consisting of titanium, chromium, tantalum, titanium-tungsten and nickel-chromium.

15. A method of making a field emitter device, comprising the following steps:
   providing a substrate;
   depositing a continuous layer of a low work function material on the substrate;
   depositing in situ by evaporation or sputtering a non-polymerized randomly patterned etch mask with a relatively high melting point on the base material, said etch mask comprising randomly located discrete nuclei with discontinuities therebetween thereby exposing portions of the base material beneath the discontinuities while covering other portions thereof beneath the nuclei;
   etching the exposed portions of the base material by applying an ion etch after the deposition of nuclei begins, wherein the base material etches at a greater rate than the etch mask so as to form valleys in the base material with base tips between the valleys;
   removing the etch mask from the base material; and then
   depositing a low work function material on the base material, thereby forming emission tips between the valleys.

16. The method as recited in claim 15 wherein the substrate is selected from the group consisting of glass, silicon and a metal.

17. The method as recited in claim 15 wherein the base material is copper.

18. The method as recited in claim 15 wherein the etch mask is deposited by evaporation.

19. The method as recited in claim 15 wherein the etch mask is deposited by sputtering.

20. The method as recited in claim 15 wherein the etch mask is selected from the group consisting of aluminum-oxide, carbon and gold.

21. The method as recited in claim 15 wherein the etch mask is between 10 angstroms and 100 angstroms thick.

22. The method as recited in claim 15 wherein the valleys are between 100 angstroms and 1 micron deep.

23. The method as recited in claim 15 wherein the base material etches at at least twice the rate of the etch mask.

24. The method as recited in claim 15 wherein only the exposed portions of the base material are etched, after the ion etch the remaining etch mask is removed by a separate etch, and the emission tips assume a rectangular pyramid shape.

25. The method as recited in claim 15 wherein the ion etch completely removes the etch mask and the ion etch is continued until the emission tips assume a conical pyramid shape.

26. The method as recited in claim 15 wherein the work function of the low work function material is less than 2.5 electron-volts.

27. The method as recited in claim 15 wherein the low work function material is selected from the group consisting of tri-chromium mono-silicon, tantalum-nitride, cesium, tri-chromium mono-silicon silicon-dioxide, tri-chromium mono-silicon magnesium-oxide, gold silicon-dioxide, and gold magnesium-oxide.

28. The method as recited in claim 15, further comprising depositing an adhesive layer between the base material and the low work function material.

29. The method as recited in claim 28 wherein the adhesive layer is selected from the group consisting of titanium, chromium, tantalum, titanium-tungsten, and nickel-chromium.

30. The method as recited in claim 1 or 15 wherein the majority of nuclei grow in size as deposition occurs.

31. The method as recited in claim 1 or 15 wherein the etch mask consists of the nuclei.

32. The method as recited in claim 1 or 15 wherein the growth of the nuclei is three-dimensional with growth parallel to the substrate greater than growth normal to the substrate.

33. The method as recited in claim 1 or 15 wherein the majority of growth of the nuclei does not result from coalescence of the nuclei.

34. The method as recited in claim 1 or 15 wherein each nucleus grows from an initial atom or molecule deposited on the continuous layer.

35. The method as recited in claim 1 or 15 wherein the number and size of the nuclei are effected by the substrate temperature, activation of nuclei adatoms, and duration of deposition.

36. The method as recited in claim 1 or 15 wherein the width of each nucleus is less than 1,000 angstroms.

37. The method as recited in claim 1 or 15 wherein each nucleus is spaced by a discontinuity of less than 1,000 angstroms from the nearest adjacent nucleus.

38. The method as recited in claim 1 or 15 wherein the width of each nucleus is less than 1,000 angstroms and each nucleus is spaced by a discontinuity of less than 1,000 angstroms from the nearest adjacent nucleus.

39. The method as recited in claim 1 or 15, wherein the etch mask consists of the nuclei; the growth of the nuclei is three-dimensional with growth parallel to the substrate greater than growth normal to the substrate; and each nucleus grows from an initial atom or molecule deposited on the low work function material.

40. The method as recited in claim 39 wherein the width of each nucleus is less than 1,000 angstroms and each nucleus is spaced by a discontinuity of less than 1,000 angstroms from the nearest adjacent nucleus.

41. The method as recited in claim 1 or 15 wherein etch mask is formed by ion beam sputtering.

42. The method as recited in claim 1 or 15 wherein the etch mask is formed without selective illumination.

43. The method as recited in claim 1 or 15 wherein the melting point of the nuclei is above approximately 1,000° C.

44. The method as recited in claim 1 or 15 wherein the etch mask is deposited while the temperature of the substrate is less than 300° C.

45. The method as recited in claim 1 or 15 wherein the etch mask is deposited directly on the material without an intermediate layer therebetween.

46. The method as recited in claim 1 or 15 wherein the ion etch is performed without a reactive gas.

47. The method as recited in claim 1 or 15 wherein the etching begins after the entire etch mask is deposited.

48. The method as recited in claim 1 or 15 wherein the etch mask is selected from the group consisting of carbon and gold.

49. A method of making a field emitter device, comprising the following steps in the sequence set forth:
providing a substrate with a planar top surface;
depositing a continuous layer of a low work function material on the substrate wherein the work function of the low work function material is less than 2.5 electron-volts;
depositing in situ a discontinuous layer of a randomly patterned etch mask on the low work function material by evaporation or sputtering, said etch mask consisting of randomly located discrete nuclei selected from the group consisting of aluminum-oxide, carbon and gold wherein discontinuities between the nuclei are formed as the nuclei are deposited on the low work function material thereby exposing portions of the low work function material beneath the discontinuities while covering other portions thereof beneath the nuclei;
etching the exposed portions of the low work function material by applying an ion etch after depositing the mask, wherein the low work function material etches at at least twice the rate of the etch mask until the etch mask is completely removed so as to form vertical valleys in the low work function material with rectangular pyramid shaped emission tips between the valleys; and
etching the entire surface of the low work function material by continuing to apply the ion etch until the emission tips assume a conical pyramid shape.

50. The method as recited in claim 49 wherein the low work function material is selected from the group consisting of tri-chromium mono-silicon, tantalum-nitride, cesium, tri-chromium mono-silicon silicon-dioxide, tri-chromium mono-silicon magnesium-oxide, gold silicon-dioxide, and gold magnesium-oxide.

51. The method as recited in claim 49 wherein the etch mask is between 10 angstroms and 100 angstroms thick.

52. The method as recited in claim 49 wherein the valleys are between 100 angstroms and 1 micron deep.

53. The method as recited in claim 49, further comprising depositing an adhesive layer selected from the group consisting of titanium, chromium, tantalum, titanium-tungsten, and nickel-chromium between the substrate and the low work function material.

54. A method of making a field emitter device, comprising the following steps in the sequence set forth:
providing a substrate with a planar top surface;
depositing a continuous layer of an electrically conductive base material on the substrate
depositing in situ a discontinuous layer of a randomly patterned etch mask on the base material by evaporation or sputtering, said etch mask consisting of randomly located discrete nuclei selected from the group consisting of aluminum-oxide, carbon and gold wherein discontinuities between the nuclei are formed as the nuclei are deposited on the base material thereby exposing portions of the base material beneath the discontinuities while covering other portions thereof beneath the nuclei;
etching the exposed portions of the low work function material by applying an ion etch after depositing the mask, wherein the base material etches at at least twice the rate of the etch mask until the etch mask is completely removed so as to form vertical valleys in the base material with rectangular base tips between the valleys;
etching the entire surface of the base material by continuing to apply the ion etch until the base tips assume a conical pyramid shape; and
depositing a low work function material on the base material, wherein the work function of the low work function material is less than 2.5 electron-volts, thereby forming emission tips between the valleys which assume a conical pyramid shape.

55. The method as recited in claim 54 wherein the low work function material is selected from the group consisting of tri-chromium mono-silicon, tantalum-nitride, cesium, tri-chromium mono-silicon silicon-dioxide, tri-chromium mono-silicon magnesium-oxide, gold silicon-dioxide, and gold magnesium-oxide.

56. The method as recited in claim 54 wherein the etch mask is between 10 angstroms and 100 angstroms thick.

57. The method as recited in claim 54 wherein the valleys are between 100 angstroms and 1 micron deep.

58. The method as recited in claim 54, further comprising depositing an adhesive layer selected from the group consisting of titanium, chromium, tantalum, titanium-tungsten, and nickel-chromium between the substrate and the low work function material.

* * * * *